United States Patent
Riedl et al.

(10) Patent No.: US 8,603,864 B2
(45) Date of Patent: Dec. 10, 2013

(54) METHOD OF FABRICATING A SEMICONDUCTOR DEVICE

(75) Inventors: Edmund Riedl, Gebelkofen (DE); Ivan Nikitin, Regensburg (DE); Johannes Lodermeyer, Regensburg (DE); Robert Bergmann, Wiesent (DE); Karsten Guth, Soest (DE)

(73) Assignee: Infineon Technologies AG, Neubiberg (DE)

( * ) Notice: Subject to any disclaimer, the term of this patent is extended or adjusted under 35 U.S.C. 154(b) by 552 days.

(21) Appl. No.: 12/208,862

(22) Filed: Sep. 11, 2008

(65) Prior Publication Data

US 2010/0059857 A1    Mar. 11, 2010

(51) Int. Cl.
  *H01L 21/00* (2006.01)

(52) U.S. Cl.
  USPC ..................... 438/121; 257/E21.51

(58) Field of Classification Search
  USPC ............... 438/121, 123; 257/E21.51; 205/102–105, 111–113
  See application file for complete search history.

(56) References Cited

U.S. PATENT DOCUMENTS

| | | | |
|---|---|---|---|
| 4,515,671 A * | 5/1985 | Polan et al. | 204/229.5 |
| 5,326,454 A | 7/1994 | Engelhaupt | |
| 6,528,882 B2 * | 3/2003 | Ding et al. | 257/738 |
| 7,049,683 B1 * | 5/2006 | Sirinorakul et al. | 257/666 |
| 7,195,700 B2 * | 3/2007 | Uzoh et al. | 205/104 |
| 7,985,329 B2 * | 7/2011 | Preusse et al. | 205/176 |
| 2002/0056644 A1 | 5/2002 | Sakura et al. | |
| 2006/0222871 A1 | 10/2006 | Bonhote et al. | |
| 2007/0044295 A1 | 3/2007 | Chen | |
| 2007/0104869 A1 | 5/2007 | Kodas et al. | |
| 2007/0104875 A1 | 5/2007 | Kodas et al. | |
| 2007/0160837 A1 | 7/2007 | Chikamori et al. | |
| 2007/0183920 A1 | 8/2007 | Lu et al. | |
| 2009/0039486 A1 * | 2/2009 | Shimazaki et al. | 257/676 |

FOREIGN PATENT DOCUMENTS

| | | |
|---|---|---|
| CN | 1827260 A | 9/2006 |
| DE | 19547948 C1 | 11/1996 |
| JP | 02-022491 * | 1/1990 |
| NL | 1015348 C2 | 12/2001 |

* cited by examiner

*Primary Examiner* — Stephen W Smoot
*Assistant Examiner* — Sun M Kim
(74) *Attorney, Agent, or Firm* — Dicke, Billig & Czaja, PLLC (57) ABSTRACT

A method of fabricating a semiconductor device. One embodiment provides a metal carrier. A semiconductor chip is provided. A porous layer is produced at a surface of at least one of the carrier and the semiconductor chip. The semiconductor chip is placed on the carrier. The resulting structure is heated until the semiconductor chip is attached to the carrier.

5 Claims, 9 Drawing Sheets

METHOD OF FABRICATING A SEMICONDUCTOR DEVICE

BACKGROUND

The present invention relates to a method of fabricating a semiconductor device, a semiconductor device, and an electrical device.

Semiconductor chips or semiconductor dies can be attached to metal carriers like, for example, leadframes. In particular, semiconductor chips can include electrical contact pads on at least one of their surfaces wherein the semiconductor chips have to be attached to a metal carrier with the contact pad forming an electrically and thermally conducting connection there between. Moreover, the connection between the semiconductor chip and the metal carrier should have satisfactory mechanical properties like mechanical strength and stability against wear and fatigue due to thermal mechanical stress.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 11A,B illustrate schematic cross-sectional representations of an electrical device according to one embodiment.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

In addition, while a particular feature or aspect of an embodiment may be disclosed with respect to only one of several implementations, such feature or aspect may be combined with one or more other features or aspects of the other implementations as may be desired and advantageous for any given or particular application. Furthermore, to the extent that the terms "include", "have", "with" or other variants thereof are used in either the detailed description or the claims, such terms are intended to be inclusive in a manner similar to the term "comprise". The terms "coupled" and "connected", along with derivatives may be used. It should be understood that these terms may be used to indicate that two elements co-operate or interact with each other regardless whether they are in direct physical or electrical contact, or they are not in direct contact with each other. Also, the term "exemplary" is merely meant as an example, rather than the best or optimal. The following detailed description, therefore, is not to be taken in a limiting sense, and the scope of the present invention is defined by the appended claims.

The embodiments of a method of fabricating a semiconductor device and the embodiments of a semiconductor device may use various types of semiconductor chips or semiconductor substrates, among them logic integrated circuits, analog integrated circuits, mixed signal integrated circuits, sensor circuits, MEMS (Micro-Electro-Mechanical Systems), power integrated circuits, chips with integrated passives, discrete passives and so on. In general the term "semiconductor chip" as used in this application can have different meanings one of which is a semiconductor die or semiconductor substrate including an electrical circuit.

In several embodiments layers or layer stacks are applied to one another or materials are applied or deposited onto layers. It should be appreciated that any such terms as "applied" or "deposited" are meant to cover literally all kinds and techniques of applying layers onto each other. In one embodiment, they are meant to cover techniques in which layers are applied at once as a whole, like, for example, laminating techniques, as well as techniques in which layers are deposited in a sequential manner, like, for example, sputtering, plating, molding, chemical vapor deposition (CVD) and so on.

The semiconductor chips may include contact elements or contact pads on one or more of their outer surfaces wherein the contact elements serve for electrically contacting the semiconductor chips. The contact elements may be made from any electrically conducting material, e.g., from a metal as aluminum, gold, or copper, for example, or a metal alloy, or an electrically conducting organic material, or an electrically conducting semiconductor material.

The metal carrier can be any substrate consisting of a metal or a metal alloy. The metal carrier, for example, can consist of a leadframe. The metal carrier can also consist of any sort of electrically conducting or non-conducting base layer covered with a metal layer of an elemental metal or a metal alloy. The metal carrier can also consist of a homogenous base layer including an elemental metal or a metal alloy.

Figure 1:
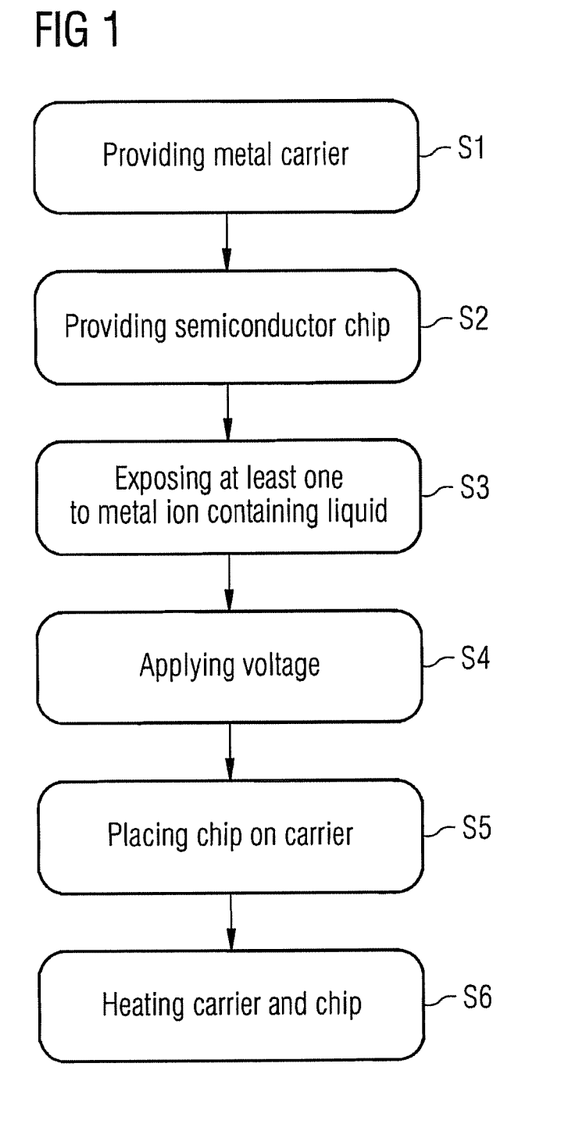
FIG. 1 illustrates a flow diagram of a method of fabricating a semiconductor device according to one embodiment.

Referring to FIG. 1, there is illustrated a flow diagram of a method of fabricating a semiconductor device according to one embodiment. The method includes providing a metal carrier (s1), providing a semiconductor chip (s2), exposing at least one of the carrier and the semiconductor chip to a metal ion containing liquid (s3), applying a voltage between the metal ion containing liquid and at least one of the carrier and the semiconductor chip (s4), placing the semiconductor chip on the carrier (s5), and heating the carrier and the semiconductor chip until the semiconductor chip is attached to the carrier (s6).

According to one embodiment, only the carrier is exposed to a metal ion containing liquid.

According to one embodiment, only the semiconductor chip is exposed to a metal ion containing liquid.

According to one embodiment, both the carrier and the semiconductor chip are exposed to a metal ion contain liquid.

According to one embodiment, a semiconductor wafer including a plurality of semiconductor chips or semiconductor dies is exposed to a metal ion contain liquid.

According to one embodiment, the method further includes producing a porous layer at a surface of at least one of the carrier and the semiconductor chip. According to a further embodiment thereof, the porous layer includes a surface structure that is at least one of dendritic, platelet-like, needle-shaped, sponge-like and spherical. According to a further embodiment, the porous layer includes a thickness in a range from 10 nm to 20 µm, the range covering also all incremental values, the increment being 1 nm.

According to one embodiment, the carrier is a leadframe.

According to one embodiment, the heating is carried out at a temperature which is less than or equal to 450° C., covering also all values incrementally decreasing from 450° C., the increment being 1° C.

According to one embodiment, the voltage is applied such that at least one of a continuous current and a pulsed current is generated. According to one embodiment the voltage is applied between a metallic body immersed into the metal ion containing liquid and at least one of the metal carrier and the semiconductor chip.

According to one embodiment, the heating is carried out such that a sintered structure is produced at an interface between the carrier and the semiconductor chip. In addition ultrasound waves can be applied to the structure to enhance the interdiffusion process. In one embodiment or in addition a constant and static pressure can be applied to the structure so that the heating temperature can be further reduced.

Figure 2:
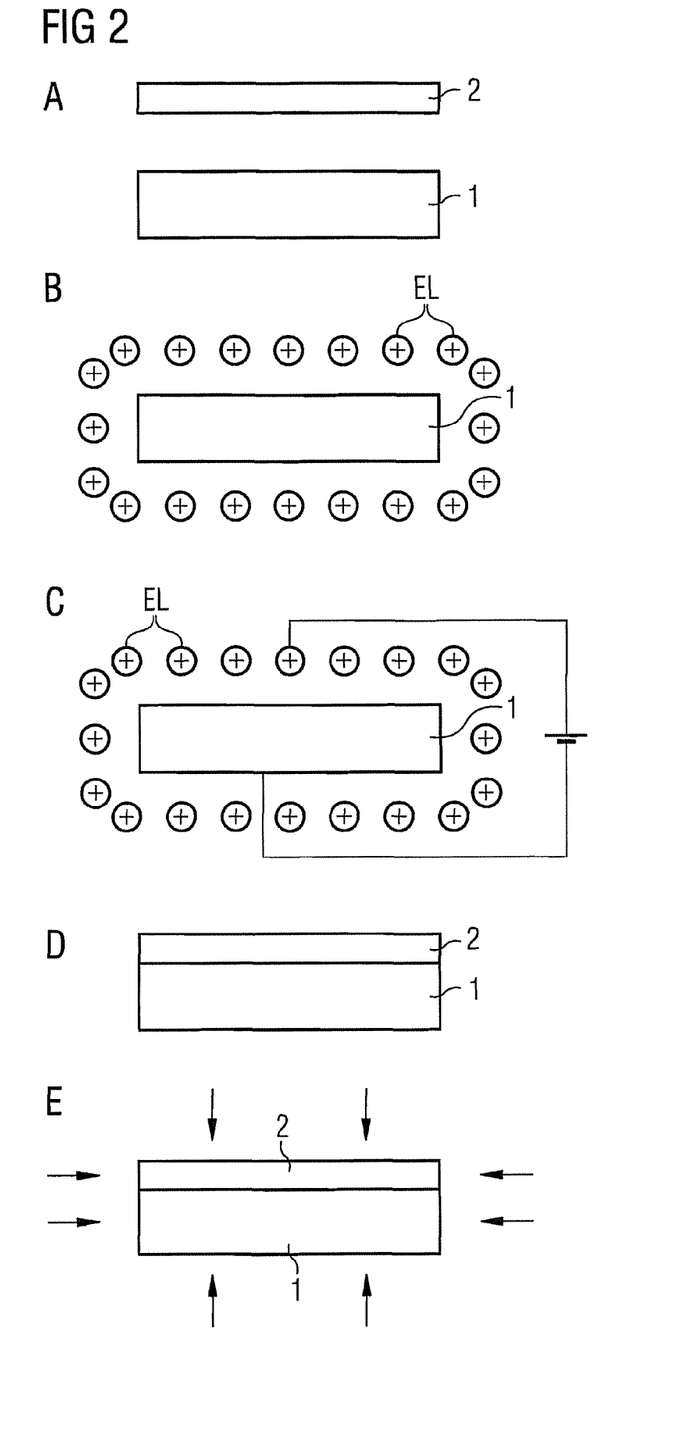
FIGS. 2A-E illustrate schematic cross-sectional representations of intermediate products for illustrating one embodiment of a method of fabricating a semiconductor device.

Referring to FIGS. 2A-E, there are illustrated cross-sectional representations of intermediate products for illustrating an embodiment of a method of fabricating a semiconductor device. FIG. 2A illustrates cross-sectional representations of a metal carrier 1 and a semiconductor chip 2. It is an aim of the method to attach the semiconductor chip 2 to the metal carrier 1 so that they are strongly and steadily fixed to each other. The semiconductor chip 2 may include contact elements (not illustrated) on at least one of its surfaces and the semiconductor chip 2 may become attached with one of its contact elements to the metal carrier 1. However, it is also possible that a non-conducting surface of the semiconductor chip 2 is to be connected to the metal carrier 1. FIG. 2B illustrates that the metal carrier 1 is exposed to a metal ion containing liquid EL. The metal ion containing liquid EL, for example, can consist of an electrolyte. FIG. 2C illustrates that a voltage is applied between the metal ion containing liquid EL and the metal carrier 1. FIG. 2D illustrates how the semiconductor chip is placed on the metal carrier 1. As illustrated, the semiconductor chip 2 can be placed with one of its main surfaces onto one of the main surfaces of the metal carrier 1. FIG. 2E illustrates the heating of the metal carrier 1 and the semiconductor chip 2. The heating is conducted until the semiconductor chip 2 is attached to the metal carrier 1. The heating can be performed such that heat is supplied to all sides of the structure as indicated by the arrows.

Figure 3:
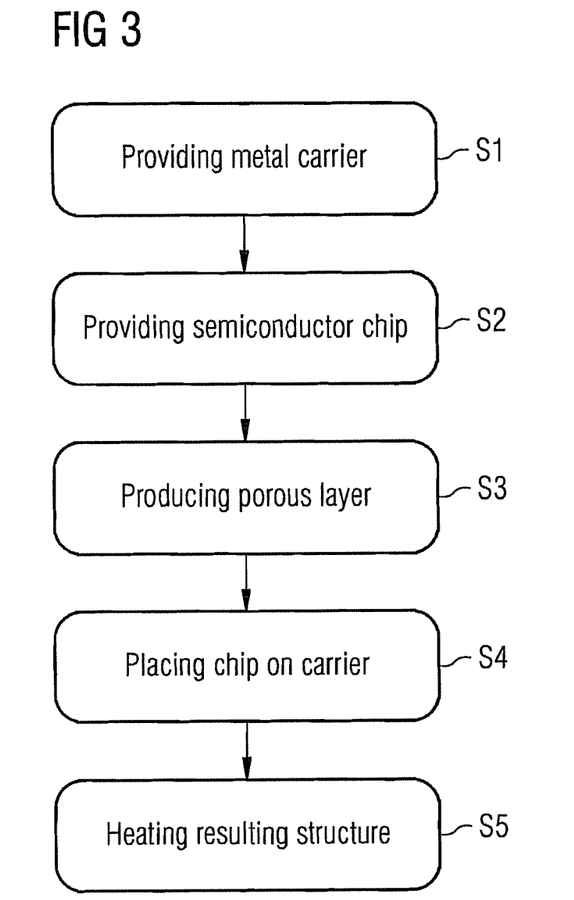
FIG. 3 illustrates a flow diagram of a method of fabricating a semiconductor device according to one embodiment.

Referring to FIG. 3, there is illustrated a flow diagram of a method of fabricating a semiconductor device according to one embodiment. The method includes providing a metal carrier (s1), providing a semiconductor chip (s2), producing a porous layer at a surface of at least one of the metal carrier and the semiconductor chip (s3), placing the semiconductor chip on the carrier (s4), and heating the resulting structure until the semiconductor chip is attached to the carrier (s5).

According to one embodiment, a porous layer is produced only at a surface of the metal carrier.

According to one embodiment, a porous layer is produced only at a surface of the semiconductor chip.

According to one embodiment, a porous layer is produced at a surface of the metal carrier and at a surface of the semiconductor chip.

According to one embodiment, a porous layer is produced at a surface of a semiconductor wafer including a plurality of semiconductor chips or semiconductor dies.

According to one embodiment, the porous layer includes a surface structure that is at least one of dendritic, platelet-like, needle-shaped, sponge-like and spherical.

According to one embodiment, the method further includes exposing at least one of the carrier and the semiconductor chip to a metal ion containing liquid, and applying a voltage between the metal ion containing liquid and at least one of the carrier and the semiconductor chip. According to one embodiment, the voltage is applied such that at least one of a continuous current and a pulsed current is generated. According to one embodiment the voltage is applied between a metallic body immersed into the metal ion containing liquid and at least one of the metal carrier and the semiconductor chip.

According to one embodiment, the porous layer includes a thickness in a range from 10 nm to 20 µm, the range covering also all incremental values, the increment being 1 nm.

According to one embodiment, the metal carrier is a leadframe.

According to one embodiment, the heating is carried out at a temperature less than or equal to 450° C., covering all values incrementally decreasing from 450° C., the increment being 1° C. According to one embodiment, the heating is carried out such that a sintered structure is produced at an interface between the carrier and the semiconductor chip. In addition, ultrasound waves can be applied to the structure to enhance the interdiffusion process. In one embodiment, a constant and static pressure can be applied to the structure so that the heating temperature can be further reduced.

Figure 4:
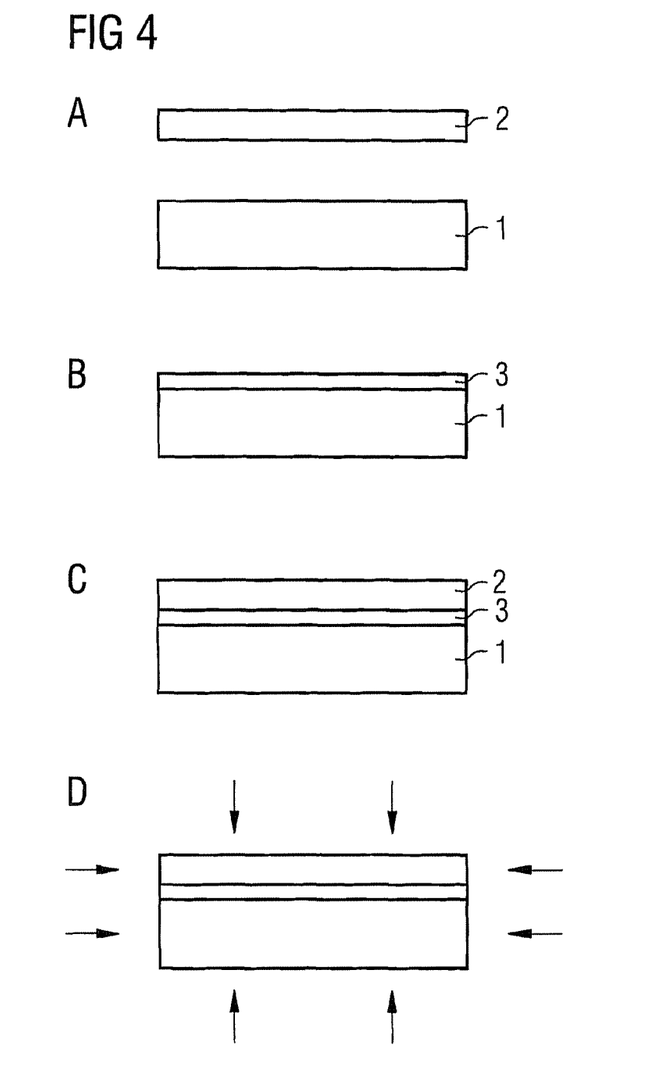
FIGS. 4A-D illustrate schematic cross-sectional representations of intermediate products for illustrating one embodiment of a method of fabricating a semiconductor device.

Referring to FIGS. 4A-D, there are illustrated cross-sectional representations of intermediate products for illustrating one embodiment of a method of fabricating a semiconductor device. FIG. 4A illustrates a metal carrier 1 and a semiconductor 2. FIG. 4B illustrates an intermediate product obtained after producing a porous layer 3 on a main surface of the metal carrier 1. In principle there are different ways of producing the porous layer 3 at the surface of the metal carrier 1. The porous layer 3, for example, can be deposited on the surface of the metal carrier 1. The deposition process can, for example, be carried out as explained above in connection with FIGS. 1 and 2A-E. The porous layer 3 can in principle also be produced by converting a previously non-porous surface layer of the metal carrier 1 into a porous layer 3 by any method. FIG. 4C illustrates an intermediate product obtained after placing the semiconductor chip 2 onto the metal carrier 1 so that the porous layer 3 forms an intermediate layer between the metal carrier 1 and the semiconductor chip 2. FIG. 4D illustrates the heating of the resulting structure until the semiconductor chip 2 is attached to the metal carrier 1. The heating can be performed such that heat is supplied to all sides of the structure as indicated by the arrows.

Figure 5:
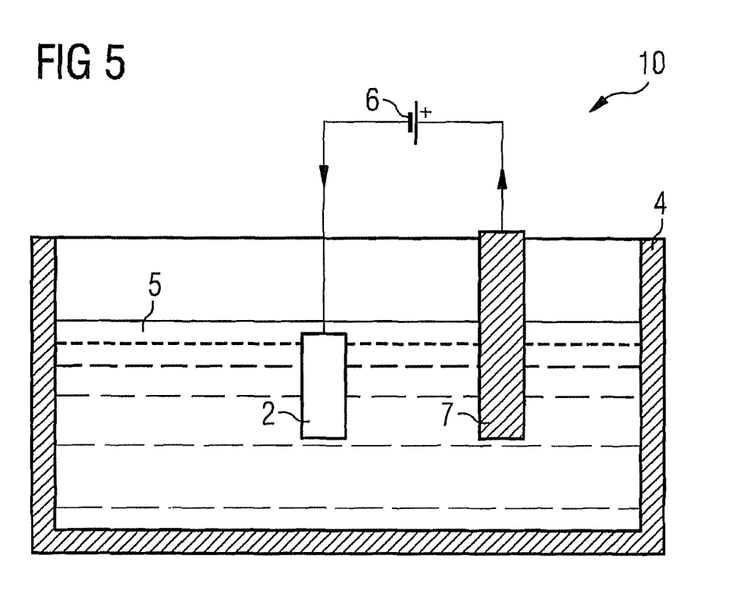
FIG. 5 illustrates a schematic cross-sectional representation of one embodiment of an apparatus utilized for producing a porous layer on a metal carrier.

Referring to FIG. 5, there is illustrated a cross-sectional side view representation of an apparatus for producing a porous layer on a surface of at least one of a metal carrier and a semiconductor chip or semiconductor wafer. The apparatus 10 substantially consists of an electroplating bath 4 containing an electrolytic solution 5 which can be composed of various components.

A metal carrier 2 is immersed into the electrolytic solution 5 in order to be plated with a metallic layer like, for example, a silver layer. The metal carrier 2, for example, can consist of a copper leadframe or a copper base plate which is to be formed to a leadframe after plating. The metal carrier 2 is connected to the negative terminal of a voltage source 6 so that it forms a cathode during the electro-plating process. Also immersed into the electrolytic solution 5 is a metallic body 7 which is connected to the positive terminal of the voltage source 6 and thus forms an anode during the electro-plating process. The anode 7 can work as an active anode or as a passive anode. As an active anode it includes a material which is to be deposited onto the metal carrier 2. The electrolytic process is such that positive ions of the material of the anode 7 are released from the anode 7 and propagate towards the metal carrier 2 and deposit onto the outer surface of the metal carrier 2 and at the same time electrons flow from the anode 7 via the voltage source 6 to the metal carrier 2. As a passive anode the anode 7 is formed of a material such that no ions are released from the anode 7 into the electrolytic solution 5 and instead the anode 7 only provides for an electrical potential within the electrolytic solution 5 and the electrolytic solution 5 itself contains the constituents which are to be deposited onto the metal carrier 2. Also in this case electrons are flowing from the anode 7 via the voltage source 6 to the metal carrier 2.

In one embodiment, the electrolytic solution 5 consists of an aqueous solution containing silver nitrate ($AgNO_3$) and ammonia ($NH_3$) wherein the silver nitrate has a concentration of 0.01 to 0.025 mol/kg and the mass fractions of silver nitrate and ammonia are 8.5 g and 6 g of the 25% solution, respectively. In this embodiment the anode 7 plays the role of a passive anode and can, for example, be fabricated of a steel material.

Generally in galvanic electroplating process a partial chemical reactions occur wherein a cathodic partial chemical reaction occurs at the surface of the metal carrier 2 and an anodic partial chemical reaction occurs at the surface of the anode 7. The cathodic partial reaction substantially consists in the reduction of the silver ion species in the electrolytic solution 5 and can be written as (without considering formation of complexes in the solution):

(1)

The anodic partial chemical reaction, for example, can be as follows:

(2)

In one embodiment the anode 7 can play the role of an active anode which means that it contains the material which is to be deposited onto the metal carrier 2. If silver is to be deposited onto the metal carrier 2, the anode 7 must contain or ultimately consist of silver. The electrolytic solution 5 can in this case be any conventional one and needs not to be a silver nitrate solution.

Figure 6:
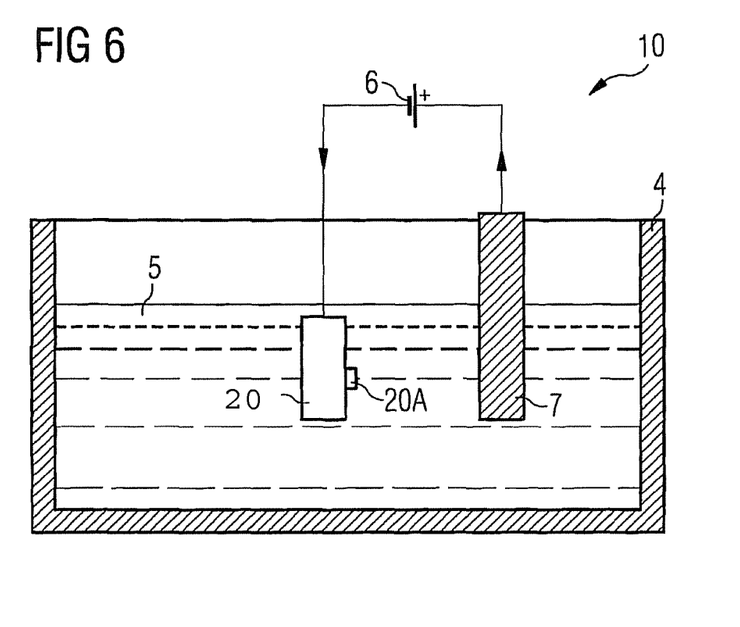
FIG. 6 illustrates a schematic cross-sectional representation of one embodiment of an apparatus utilized for producing a porous layer on a semiconductor chip.

Referring to FIG. 6, there is illustrated a cross-sectional side view illustration of an electroplating apparatus for illustrating a further embodiment. According to FIG. 6 as compared with the embodiment of FIG. 5, instead of a metal carrier 2 a semiconductor chip 20 is immersed into the electrolytic solution 5. The semiconductor chip 20 may include a contact pad 20A onto which a metallic layer is to be deposited. The semiconductor chip 20 is to be attached with the contact pad 20A in a later process onto a major surface of a metal carrier. However, it is also possible that the semiconductor chip 20 does not include a contact pad 20A at a surface which is to be covered with a metallic layer in the electroplating process. In this case, a thin electrically conductive seed layer is deposited onto the respective surface of the semiconductor chip 20 before being immersed into the electrolytic solution 5 so that the electroplating process can be performed. The seed layer, for example, can be deposited by sputtering. When the semiconductor chip 20 is immersed into the electrolytic solution 5, the conductive pad 20A or the seed layer will be electrically connected to the negative terminal of the voltage source 6. The anode 7 can play the role of an active anode or a passive anode as described before.

The electro-plating bath 4 including the electrolytic solution 5 described above in connection with FIGS. 5 and 6 is used for depositing a porous silver layer on a metal carrier 2 or a semiconductor chip 20. The application of a current starts the deposition of the porous layer on the surface of the metal carrier 2 or an electrically conductive surface of the semiconductor chip 20. The rate of the deposition operation can be controlled by regulating the current density. In the exemplary embodiment as outlined above, a current density can be used in a range from 0.5 to 2 $A/cm^2$ in a constant current modus. The current can be applied in the form of at least one of a continuous current or a pulsed current. That means during the electro-plating process the current can be constant in time or it can be varying over time.

Referring to FIGS. 7A-E, there are illustrated current versus time diagrams to illustrate different embodiments of time-varying electro-plating currents. With these embodiments characteristics like thickness, porosity and morphology of the porous layer can be adjusted in a precise manner.

Figure 7:
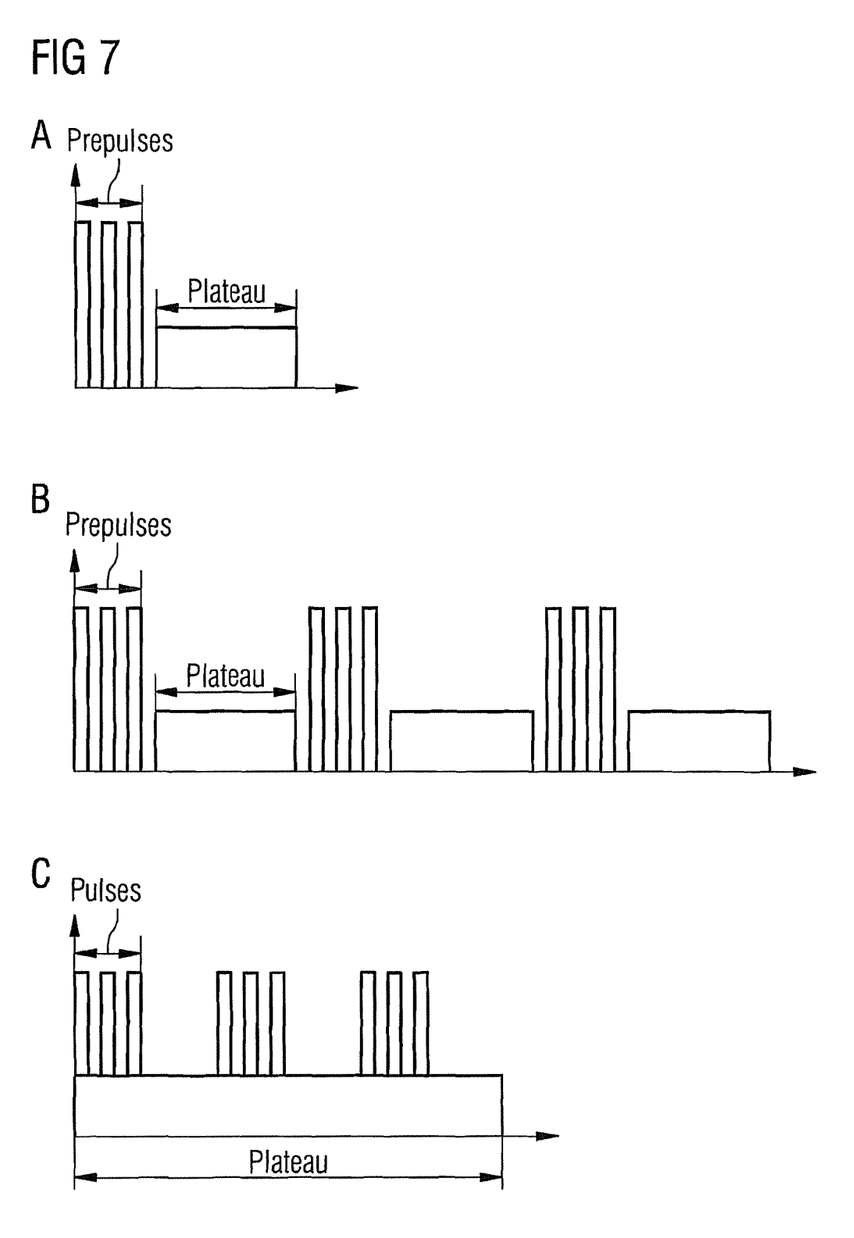
FIGS. 7A-E illustrate time/current diagrams for illustrating embodiments of a method of producing a porous layer.

FIG. 7A illustrates one embodiment in which by applying a particular number of pre-pulses a plurality of seed grains can be initially produced by which a homogenous, dense seed layer can be provided. Thereafter, a current plateau is applied having a time duration considerably longer than the duration of each one of the pre-pulses and a maximum current density considerably lower than the maximum of the current density of the pre-pulses. During the current plateau a further porous layer is grown onto the initial layer generated by the pre-pulses, the further layer including optimal dendritic properties. In general, the result depends on the number of the pre-pulses, the time duration of each one of the pre-pulses, the length of the breaks in between the pre-pulses and the maximum current density of the pre-pulses.

FIG. 7B illustrates a further embodiment obtained by three times repeating of the pattern of FIG. 7A. With such a pattern a three-dimensional layer structure can be produced having dendritic planes of different density.

FIG. 7C illustrates a further embodiment including a continuous, time-independent plateau or base current and in addition current pulses on top of the plateau current. The current pulses can be grouped together so as to form, for example, as illustrated three consecutive pulses in each group wherein the groups of pulses are separated from each other by a break.

FIG. 7D illustrates a further embodiment in which current pulses of different polarity are applied and thereafter a current plateau of a duration considerably longer than the length of the pulses is applied.

FIG. 7E illustrates a further embodiment in which only current pulses are applied, the pulses being of equal pulse length and breaks in-between the pulses, the breaks having equal durations comparable to the pulse durations.

According to one embodiment, after placing the semiconductor chip on the metal carrier the whole structure is sintered at 300° C. for one hour in a nitrogen atmosphere so that as a result the semiconductor chip is firmly and reliably attached to the metal carrier and the porous layer disposed between the semiconductor chip and the metal carrier includes a sintered structure. Depending on the structure and the average dimensions of the nanoscopic structures in the porous layer, it is also possible to carry out the heating process at a temperature lower than 450° C. or even lower than 300° C., the temperature range generally covering all values incrementally decreasing from 450° C., the increment being 1° C.

Figure 8:
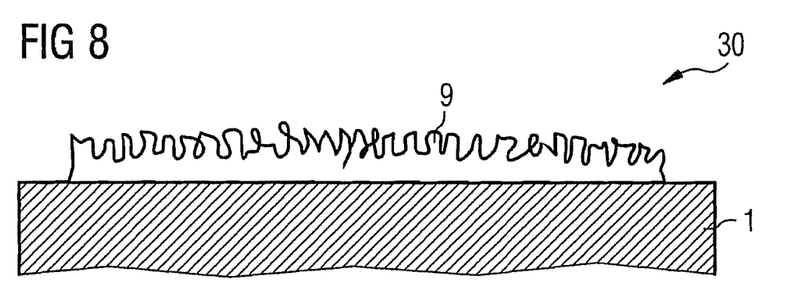
FIG. 8 illustrates a cross-sectional representation of an intermediate product.

Referring to FIG. 8, there is illustrated a cross-sectional representation of one embodiment of an intermediate product. The intermediate product 30 includes a metal carrier 1 and a porous silver layer 9 deposited onto a main surface of the metal carrier 1. The porous layer 9 is characterized by rough and porous conditions or morphology. The porosities are in the range from 1-1000 nm, covering all incremental values, the increment being 1 nm. This condition may be characterized by crystalline structures and/or dendritic, platelet and sponge structures. Furthermore, needle-shaped pillars may project randomly next to one another out of the layer. These needle-shaped structures and the platelets may be provided with sharp and precise edges. A semiconductor chip is to be attached to the metal carrier 1 with the porous layer 9 in-between. The porous and rough condition of the porous layer 9 brings about much stronger adhesion of the semiconductor chip to the metal carrier 1 so that the porous layer 9 serves the purpose of an adhesion promoter layer. The bonding forces produced by a sintering process are much stronger than with homogenous and smooth surfaces of the metal carrier 1 and the semiconductor chip. As outlined above, the porous layer 9 can also be produced in one embodiment or in addition onto the surface of the semiconductor chip.

Figure 9:
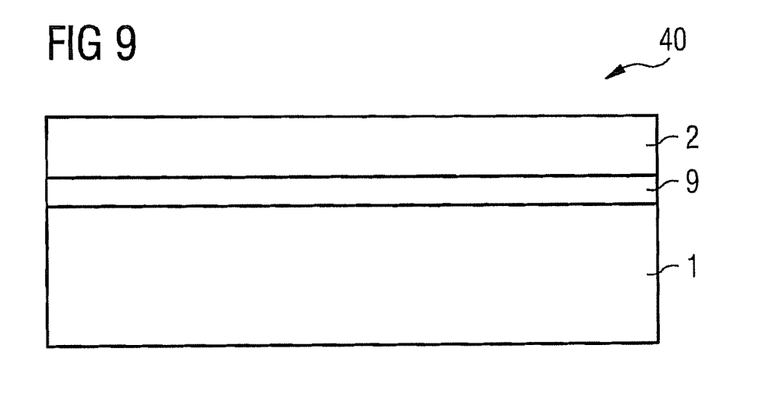
FIG. 9 illustrates a schematic cross-sectional representation of a semiconductor device according to one embodiment.

Referring to FIG. 9, there is illustrated a semiconductor device 40 according to one embodiment. The semiconductor device 40 includes a metal carrier 1, a semiconductor chip 2 disposed above the carrier 1, and a porous layer 9 provided between the carrier 1 and the semiconductor chip 2.

According to one embodiment, the porous layer 9 includes a surface structure that is at least one of dendritic, platelet-like, needle-shaped, sponge-like and spherical.

According to one embodiment, the porous layer 9 includes a thickness in a range from 10 nm to 20 μm, the range covering also all incremental values, the increment being 1 nm.

According to one embodiment, the metal carrier 1 is a leadframe.

According to one embodiment, the porous layer 9 includes silver.

According to one embodiment, the metal carrier includes copper.

According to one embodiment, the porous layer 9 includes a sintered structure.

According to one embodiment, the semiconductor chip 2 includes a contact element or contact pad adjacent to the porous layer 9.

According to one embodiment, the semiconductor chip 2 includes an electrically conducting seed layer adjacent to the porous layer 9.

Figure 10:
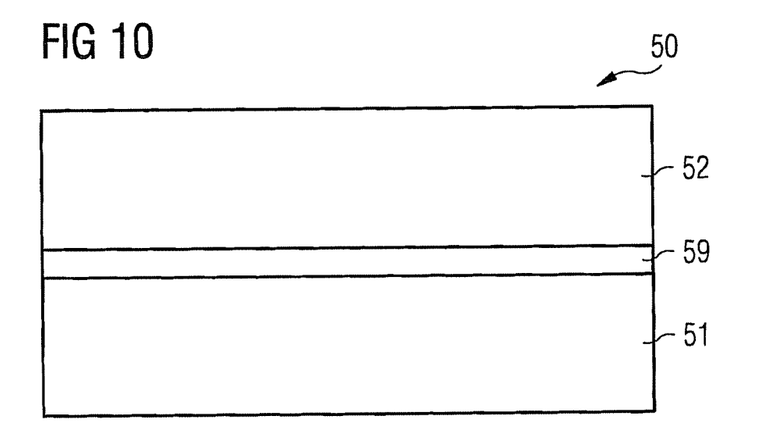
FIG. 10 illustrates a schematic cross-sectional representation of an electrical device according to one embodiment.

Referring to FIG. 10, there is illustrated a cross-sectional representation of an electrical device according to one embodiment. The electrical device 50 includes a first metal conductor 51, a second metal conductor 52, and an electrically conducting porous layer 59 provided between the first metal conductor 51 and the second metal conductor 52.

According to one embodiment, the porous layer 59 includes a surface structure that is at least one of dendritic, platelet-like, needle-shaped, sponge-like and spherical.

According to one embodiment, the porous layer 59 includes a thickness in a range from 10 nm to 20 μm, the range covering also all incremental values, the increment being 1 nm.

According to one embodiment, the porous layer 59 includes a sintered structure.

According to one embodiment, the porous layer 59 includes silver.

Figure 11:
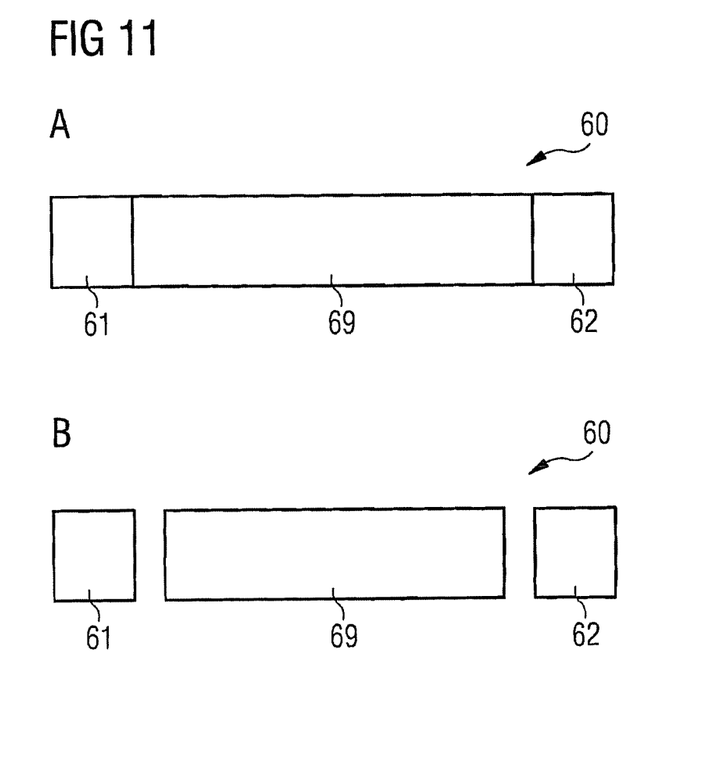

Referring to FIG. 11A, there is illustrated a cross-sectional representation of an electrical device according to one embodiment. The electrical device 60 includes a fuse, the fuse including an electrically conducting porous material 69. The electrically conducting porous material 69 can be arranged between a first electrically conducting element 61 and a second electrically conducting element 62.

The electrical device 60, for example, can be utilized in power semiconductor devices. By precisely adjusting the structural dimensions of the porous layer 69, the melting point of the porous material can be adjusted to a desired value so that a temperature rise leads to a malfunction of the electrical device by melting of the connections between the porous material 69 to the electrically conducting elements 61 and 62. As illustrated in FIG. 11B, due to the volume reduction of the porous material 69, a tear-off occurs on either one or both sides adjacent to the electrically conducting elements 61 and 2 so that current flow through the fuse is interrupted.

According to one embodiment, the porous material 69 is at least one of dendritic, platelet-like, needle-shaped, sponge-like and spherical.

According to one embodiment, the fuse is a cut-out.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of fabricating a semiconductor device comprising:
   providing a metal carrier;
   providing a semiconductor chip;
   exposing at least one of the carrier and the semiconductor chip to a metal ion containing liquid;
   applying a voltage between the metal ion containing liquid and at least one of the carrier and the semiconductor chip to produce a porous layer at a surface of at least one of the carrier and the semiconductor chip;

placing the chip on the carrier; and heating the carrier and the semiconductor chip until the chip is attached to the carrier, wherein applying the voltage comprises applying the voltage such that at least one of a continuous current and a pulsed current is generated by:

applying a series of current pulses, each current pulse of the series of current pulses having an equal duration but having alternating first and second polarities such that each pulse of the series has an opposing polarity to that of an adjacent current pulse, and thereafter applying a current plateau of a duration longer than the length of the pulses, wherein pulses of the series having the first polarity have a maximum current density higher than that of pulses having the second polarity, and wherein the current plateau has the first polarity and has a maximum current density less than that of the pulses of the series having the first polarity.

2. The method of claim 1, wherein the porous layer comprises a surface structure that is at least one of dendritic, platelet-like, needle-shaped, sponge-like and spherical.

3. The method of claim 1, wherein the porous layer comprises a thickness in a range from 10 nm to 20 μm.

4. The method of claim 1, comprising wherein the metal carrier is a leadframe.

5. The method of claim 1, comprising carrying out heating at a temperature of less than or equal to 450° C.

* * * * *